US011358168B2

(12) United States Patent
Ma et al.

(10) Patent No.: US 11,358,168 B2
(45) Date of Patent: Jun. 14, 2022

(54) COATING APPARATUS (71) Applicant: VisEra Technologies Company Limited, Hsin-Chu (TW)

(72) Inventors: Shao-Wei Ma, Kaohsiung (TW); Chang-Wei Chen, Kaohsiung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 521 days.

(21) Appl. No.: 16/444,382

(22) Filed: Jun. 18, 2019

(65) Prior Publication Data
US 2020/0398299 A1   Dec. 24, 2020

(51) Int. Cl.
C23C 14/50 (2006.01)
H01J 37/34 (2006.01)
B05B 13/02 (2006.01)
B05B 7/04 (2006.01)
B05B 13/04 (2006.01)
H01J 37/32 (2006.01)

(52) U.S. Cl.
CPC ........ B05B 13/0242 (2013.01); B05B 7/0416 (2013.01); B05B 13/0285 (2013.01); B05B 13/0405 (2013.01); B05B 13/0442 (2013.01); C23C 14/505 (2013.01); H01J 37/32431 (2013.01); H01J 37/3411 (2013.01)

(58) Field of Classification Search
CPC ..... C23C 14/505; C23C 14/50; H01L 21/673; H01J 37/32715
See application file for complete search history.

(56) References Cited

U.S. PATENT DOCUMENTS 3,986,478 A * 10/1976 Galvin ................. C23C 14/505
                                                  118/730
4,992,298 A *  2/1991 Deutchman ...... B29D 11/00009
                                                  204/192.11
(Continued)

FOREIGN PATENT DOCUMENTS

CN       105324513 A     2/2016
CN       206736352 U    12/2017
(Continued)

OTHER PUBLICATIONS

Office Action with the search report issued in corresponding TW application No. 108126941 Jun. 10, 2020.

Primary Examiner — John J Brayton
(74) Attorney, Agent, or Firm — Muncy, Geissler, Olds & Lowe, P.C.

(57) ABSTRACT

A coating apparatus includes a process chamber, a rotation device, and a rotation holder. The rotation device is disposed in the process chamber. The rotation holder is connected to the rotation device. The rotation holder includes two extension elements, two retaining elements, and two pins. The two extension elements are disposed around a center axis and separated from each other, wherein each of the two extension elements has a side surface. Each of the two retaining elements has a bottom surface, one of the two retaining elements is connected to one of the side surfaces, and the other of the two retaining elements is connected to the other of the side surfaces. One of the two pins is connected to one of the bottom surfaces, and the other of the two pins is connected to the other of the bottom surfaces.

18 Claims, 7 Drawing Sheets (56) References Cited

U.S. PATENT DOCUMENTS

2008/0296148 A1* 12/2008 Li ................. C23C 14/3464
                                                                204/192.1
2011/0049100 A1* 3/2011 Han ............... H01L 21/68785
                                                                216/67

FOREIGN PATENT DOCUMENTS

| TW | 201725649 A | 7/2017 |
|---|---|---|
| WO | WO2019/089185 A1 | 5/2019 |
| WO | WO2019105671 A1 | 6/2019 |

* cited by examiner

COATING APPARATUS

BACKGROUND

Field of the Invention

The present disclosure relates to a coating apparatus, and in particular to a coating apparatus with a rotation holder.

Description of the Related Art

In the conventional art, the physical vapor deposition (PVD) apparatus is configured to coat a film on a wafer. The coating apparatus includes a rotation holder and a sputtering device. The rotation holder is configured to retain and rotate wafers. The rotation holder is disposed over the sputtering device, and the sputtering device is configured to dispense coating materials on the bottom surface of the wafers.

However, in general, the coating materials on the edge of the wafer are uneven, and thus the coating quality of the edge of the wafer may be poor, and the utilization rate of the edge of the wafer is low.

Although existing PVD apparatus has been generally adequate for their intended purposes, they have not been entirely satisfactory in all respects. Consequently, it would be desirable to provide a solution for improving the PVD apparatus.

BRIEF SUMMARY

The present disclosure provides a coating apparatus. The coating quality and uniformity of the edge of a target object can be improved by the coating apparatus.

The present disclosure provides a coating apparatus including a process chamber, a rotation device, and a rotation holder. The rotation device is disposed in the process chamber. The rotation holder is located connected to the rotation device. The rotation holder includes two extension elements, two retaining elements, and two pins. The two extension elements are disposed around a center axis and separated from each other, wherein each of the two extension elements has a side surface. Each of the two retaining elements has a bottom surface, one of the two retaining elements is connected to one of the side surfaces, and the other of the two retaining elements is connected to the other of the side surfaces. One of the two pins is connected to one of the bottom surfaces, and the other of the two pins is connected to the other of the bottom surfaces.

In some embodiments, a target object is put on the two pins, and located between the two retaining elements. The center axis passes through a center of the target object. The two extension elements, the two retaining elements and the two pins surround the center axis, and the two pins extend toward the center axis.

In some embodiments, a distance between one of the two pins and the center axis is shorter than a distance between one of the two retaining elements and the center axis.

In some embodiments, the length of one of the two retaining elements is in a range from 4 mm to 10 mm, and the length of one of the two retaining elements is measured in a direction that is perpendicular to the center axis.

In some embodiments, the length of one of the two pins is in a range from 4 mm to 10 mm, and the length of one of the two pins is measured in a direction that is perpendicular to the center axis.

In some embodiments, the thickness of one of the two pins is in a range from 1 mm to 3 mm, and the thickness of one of the two pins is measured in a direction that is parallel to the center axis.

In some embodiments, the rotation device is configured to rotate the rotation holder about a main axis. The rotation holder extends substantially perpendicular to the main axis. The main axis is parallel to and separated from the center axis.

In some embodiments, the side surfaces of the two extension elements extend perpendicular to the bottom surfaces of the two retaining elements. In some embodiments, in a cross-sectional view, the side surfaces of the two extension elements are curved surfaces, and the bottom surfaces of the two retaining elements are flat surfaces. In a plan view, the side surfaces of the two extension elements and the bottom surfaces of the two retaining elements are C shapes.

In some embodiments, the target object has an alignment mark and an identity mark, and one of the two pins covers the alignment mark or the identity mark. In some embodiments, a gap is formed between two adjacent ends of the two extension elements.

In some embodiments, the rotation holder further includes a main base connected to the rotation device; and two support frames, wherein one of the two support frames is connected to the main base and one of the two extension elements, and the other of the two support frames is connected to the main base and the other of the two extension elements. A bottom space is formed between the two support frames, and a receiving space is formed between the side surfaces of the two extension elements and in communication with the bottom space. The two retaining elements and the two pins are located in the receiving space.

In some embodiments, the center axis passes through a center of the bottom space and a center of the receiving space. The width of the bottom space is greater than a width of the receiving space. The width of the bottom space and the width of the receiving space are measured in a direction perpendicular to the center axis.

In some embodiments, the width of the bottom space is 1.01 times to 1.1 times the width of the receiving space. In some embodiments, the width of the receiving space is in a range from 4 mm to 10 mm plus a width of the target object, and the width of the bottom space is in a range from 28 mm to 64 mm plus the width of the target object.

In some embodiments, each of the two support frames further has one side surface, and each of the two extension elements further has one bottom surface, one of the bottom surfaces is connected to one of the side surfaces of the two support frames, and the other of the bottom surfaces is connected to the other of the side surfaces of the two support frames. The side surfaces of the two support frames extend perpendicular to the bottom surfaces of the two extension elements.

In some embodiments, in a cross-sectional view, the side surfaces of the two support frames are curved surfaces, the bottom surfaces of the two extension elements are flat surfaces, and in a plan view, the side surfaces of the two support frames and the bottom surfaces of the two extension elements are C shapes.

In some embodiments, each of the two support frames further has one side surface. The distance between an end of one of the two retaining elements and one of the side surfaces of the two support frames, which is close to the one of the two retaining elements, is in a range from 18 mm to 30 mm and in a direction that is perpendicular to the one of the side surfaces.

In some embodiments, the coating apparatus further includes a sputtering device disposed in the process chamber and under the rotation holder. The sputtering device is configured to dispense a coating material toward the target object.

In some embodiments, the coating apparatus further includes a vacuum device connected to the process chamber, and configured to vacuum the process chamber; and an ion assisted deposition disposed in the process chamber, and configured to emit ions to the rotation holder.

In conclusion, the coating apparatus of the present disclosure utilizes a rotation holder to retain target objects. Depend on the design of the pins, the covered area of the edge of the target objects is less, and thus the coating performance and the utilization rate of the edge of the target object may be improved. Moreover, depend on the design of the extension element and the bottom space, the coating quality and the coating uniformity of the edge of the process surface of the target object may be is improved.

BRIEF DESCRIPTION OF THE DRAWINGS

The invention can be more fully understood by reading the subsequent detailed description and examples with references made to the accompanying drawings, wherein.

DETAILED DESCRIPTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

Figure 1:
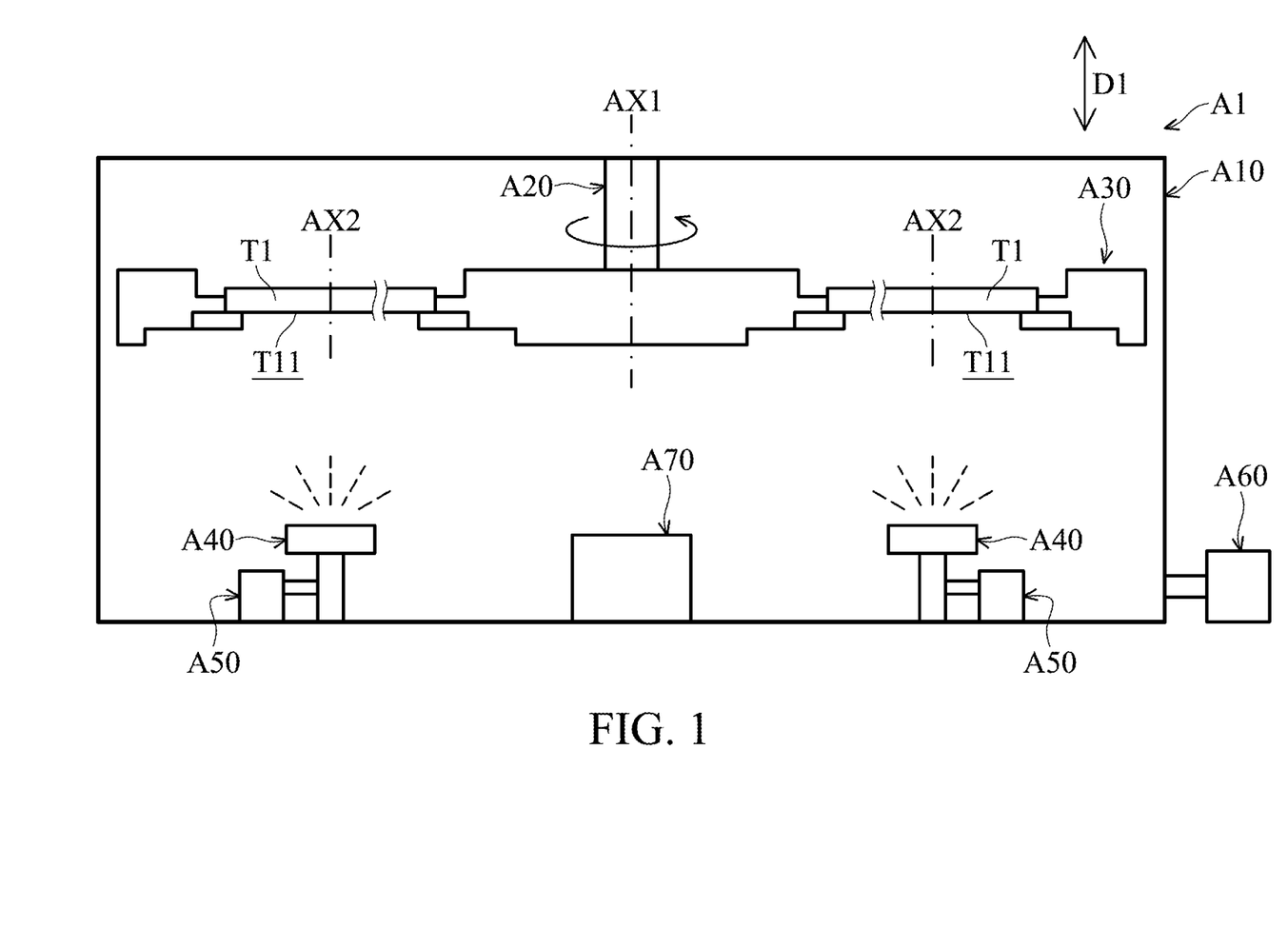
FIG. 1 is a schematic view of a coating apparatus in accordance with some embodiments of the present disclosure.

FIG. 1 is a schematic view of a coating apparatus A1 in accordance with some embodiments of the present disclosure. The coating apparatus A1 is configured to dispense coating materials on the target objects T1. In some embodiments, the coating apparatus A1 is a physical vapor deposition (PVD) apparatus. The coating materials may be insulation materials or conductive materials, but there are not limited thereto. In some embodiments, the target objects T1 are semiconductor wafers, but there are not limited thereto. Moreover, a film, such as an optical film or an insulation film, may be formed on the target object T1 by the coating materials after a coating process.

The coating apparatus A1 includes a process chamber A10, a rotation device A20, a rotation holder A30, sputtering devices A40, storage devices A50, a vacuum device A60, and an ion assisted deposition (IAD) A70. The rotation device A20 is disposed in the process chamber A10, and connected to the rotation holder A30. The rotation device A20 is configured to rotate the rotation holder A30 about a main axis AX1. In some embodiments, the main axis AX1 may be a vertical axis.

The rotation holder A30 is located in the process chamber A10 and connected to the rotation device A20. The rotation holder A30 is configured to hold one or more target objects T1, and rotate the target objects T1 about the main axis AX1. In some embodiment, the rotation holder A30 may be a disk structure, and extends substantially perpendicular to the main axis AX1. In the present disclosure the term "substantially perpendicular to" includes the means of "perpendicular to".

The sputtering devices A40 are disposed in the process chamber A10 and under the rotation holder A30. The sputtering devices A40 are configured to dispense coating materials toward the target objects T1. In this embodiment, the sputtering devices A40 are configured to dispense different coating materials toward the process surfaces T11 of the target objects T1. The target objects T1 may pass through a located over the sputtering devices A40 in sequence during the rotation of the rotation holder A30.

The storage devices A50 are disposed in the process chamber A10, and connected to the sputtering devices A40. The storage devices A50 are configured to contain the coating materials, and apply coating materials to the sputtering devices A40. In some embodiments, the storage devices A50 are located out of the process chamber A10, and connected to the sputtering devices A40 with tubes.

The vacuum device A60 is connected to the process chamber A10, and configured to vacuum the process chamber A10 in a coating process. In some embodiments, the vacuum device A60 vacuums the process chamber A10 before the sputtering devices A40 dispensing coating materials to the target objects T1. In some embodiments, the coating apparatus A1 may not include the vacuum device A60.

The ion assisted deposition A70 is disposed in the process chamber A10, and configured to emit ion to the rotation holder A30. The ion assisted deposition A70 is configured to improve the combination of the coating materials and the target objects T1, and make coating materials on the target objects T1 denser. The coating apparatus A1 may be located under the rotation device A20 and the rotation holder A30 in the main axis AX1. In some embodiments, the coating apparatus A1 may not include the ion assisted deposition A70.

In some embodiments, the coating apparatus A1 further includes a heating device (not shown in figures) disposed in the process chamber A10, and configured to heat the process chamber A10. The heating device is configured to improve the combination of the coating materials and the target objects T1. In some embodiments, the coating apparatus A1 may not include the heating device.

Figure 2:
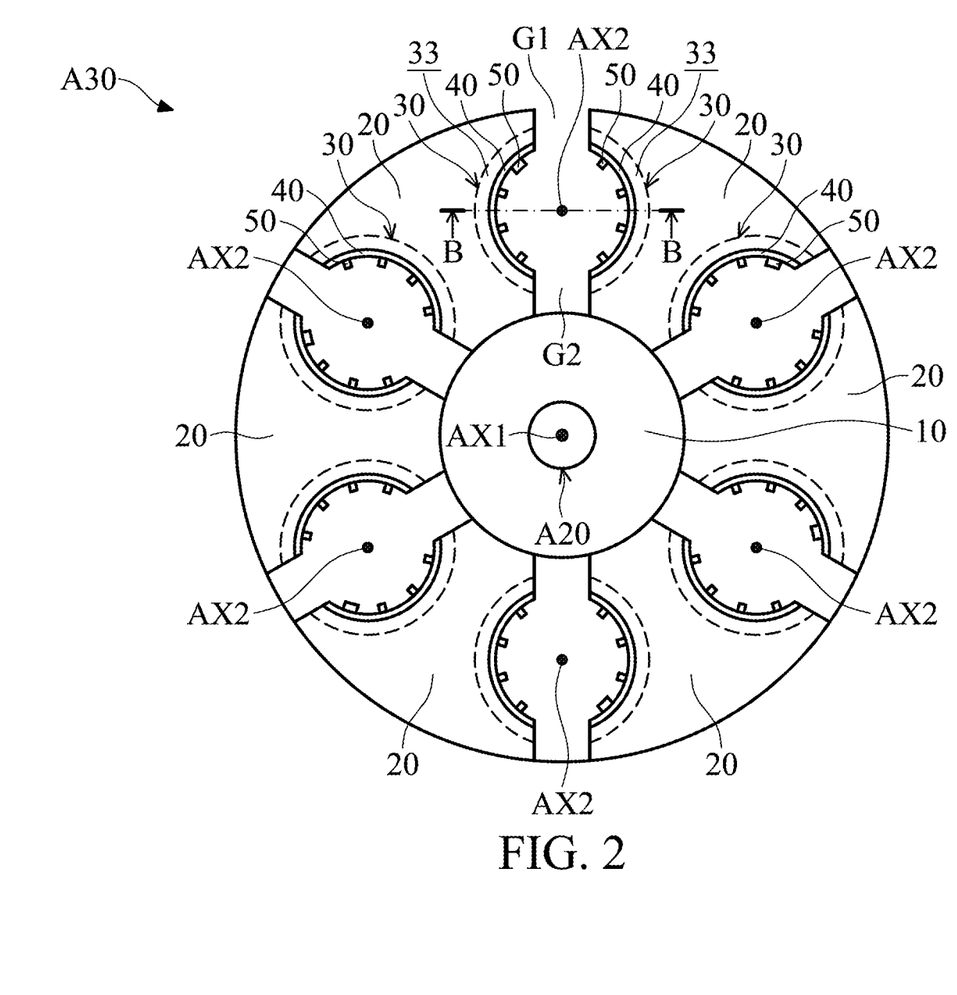
FIG. 2 is a top view of the rotation holder in accordance with some embodiments of the present disclosure.
Figure 3:
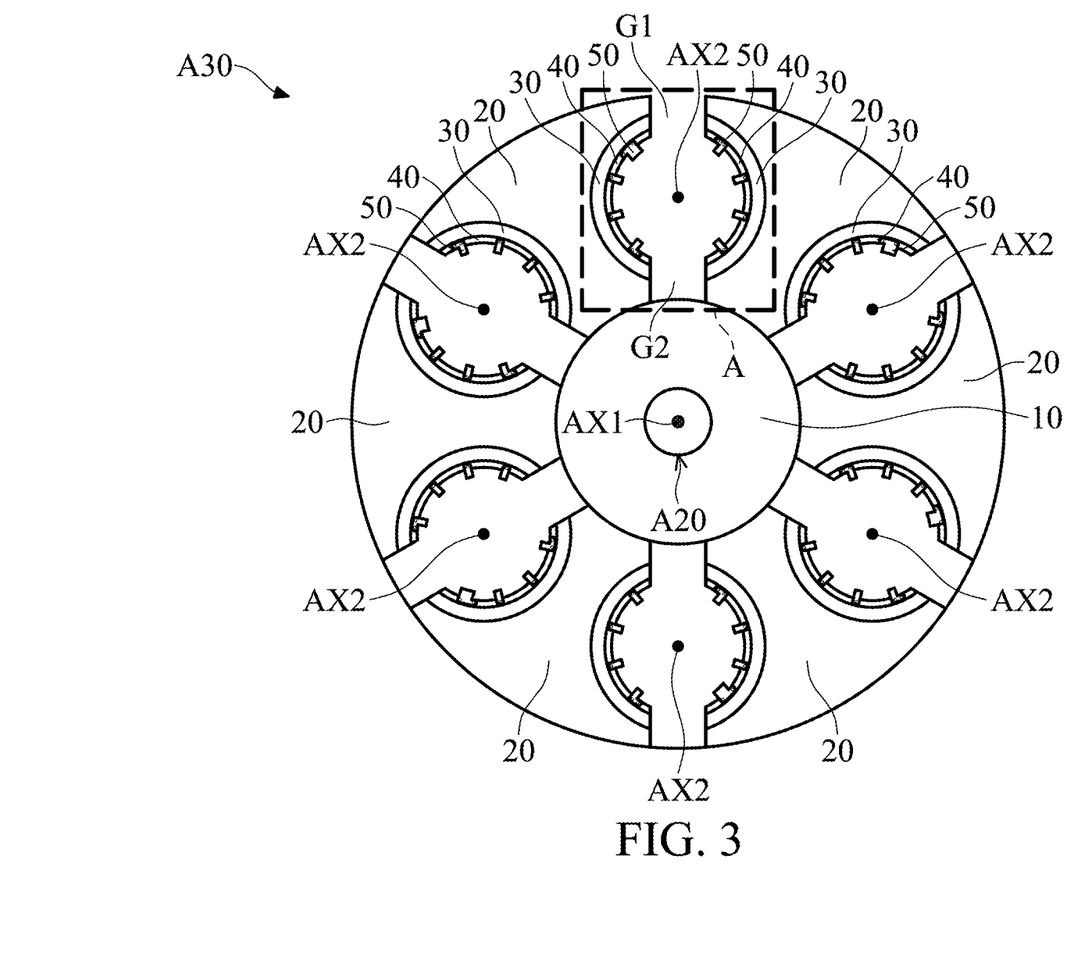
FIG. 3 is a bottom view of the rotation holder in accordance with some embodiments of the present disclosure.
Figure 4:
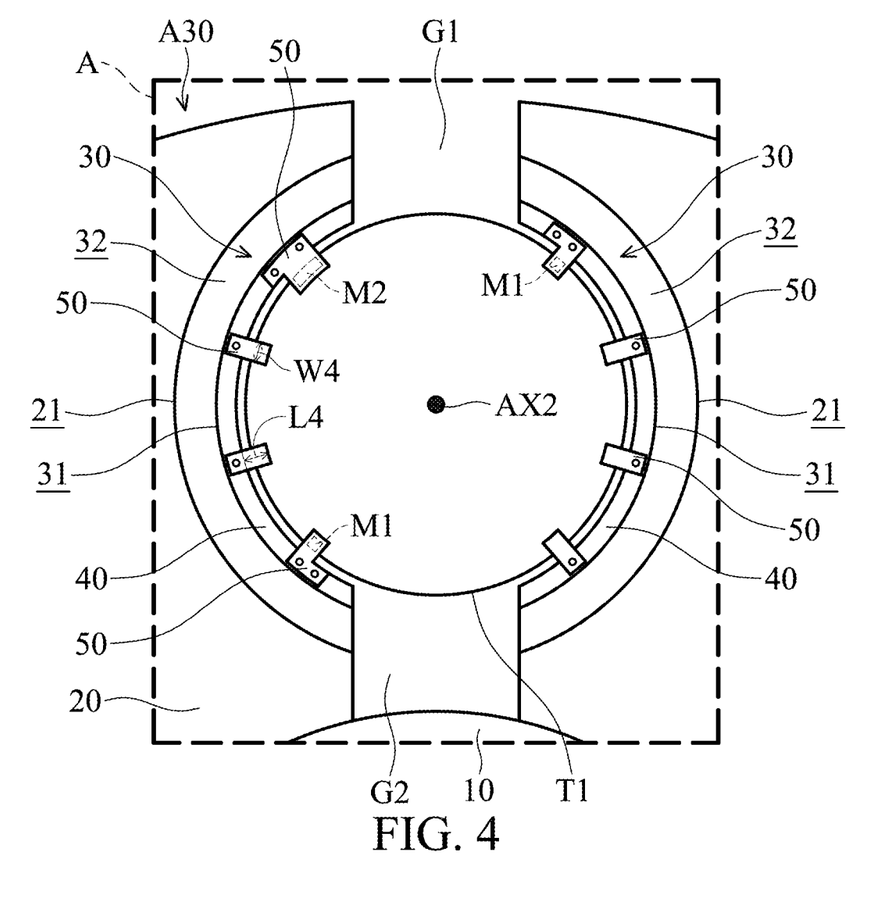
FIG. 4 is an enlarged view of the part A of FIG. 3, wherein one target object is illustrated in FIG. 4.

FIG. 2 is a top view of the rotation holder A30 in accordance with some embodiments of the present disclosure. FIG. 3 is a bottom view of the rotation holder A30 in accordance with some embodiments of the present disclosure. FIG. 4 is an enlarged view of the part A of FIG. 3, wherein one target object T1 is illustrated in FIG. 4. The rotation holder A30 includes a main base 10, support frames 20, extension elements 30, retaining elements 40, and pins 50.

The main base 10 is connected to the rotation device A20. The rotation device A20 may be connected to the center of the main base 10, but it is not limited thereto. In some embodiments, the rotation device A20 may be connected to the edge of the main base 10. The main axis AX1 may pass through the center of the main base 10. In some embodiment, the main base 10 may be a disk structure, and extends substantially perpendicular to the main axis AX1.

The support frames 20 are connected to the main base 10 and the extension elements 30. The support frames 20 are surround the main base 10, and are arranged on the main base 10 in radial arrangement. The support frames 20 may extend in different directions that are perpendicular to the main axis AX1. In this embodiment, the support frames 20 are separated from each other. In some embodiments, each of the support frames 20 is directly connected to one adjacent support frame 20.

In this embodiment, the support frames 20 are detachably disposed on the main base 10. In some embodiments, the support frames 20 and the main base 10 are formed as a single piece. The support frames 20 and the main base 10 may be made by the same materials. In some embodiments, the support frames 20 and the main base 10 are made by metal or hard plastic.

In this embodiment, there are six support frames 20, but it is not limited thereto. In some embodiment, there are at least four support frames 20. For example, there are ten or twenty support frames 20.

The extension elements 30 are connected to the support frames 20. In this embodiment, each support frame 20 is connected to two extension elements 30, but it is not limited thereto. The two extension elements 30 are disposed on two opposite sides of one support frame 20.

The extension elements 30 are C shapes. In this embodiment, two adjacent extension elements 30 extend along a circular path. Moreover, two adjacent extension elements 30 surround the target object T1. The length of the extension element 30 corresponds to one haft of the perimeter of the target object T1. In some embodiments, the length of the extension element 30 is greater one quarter of the perimeter of the target object T1.

In this embodiment, a gap G1 is formed between two adjacent ends of the support frames 20 and the extension elements 30, and a gap G2 is formed between two adjacent ends of the support frames 20 and the extension elements 30. Two adjacent support frames 20 (or the extension elements 30), the gap G1 and the gap G2 are arranged in a circular path, and form a circle.

In some embodiments, there is no gap G1, and two adjacent ends of the support frames 20 and the extension elements 30 are connected to each other. In some embodiments, there is no gap G2, and two adjacent ends of the support frames 20 and the extension elements 30 are connected to each other.

In this embodiment, the support frame 20 and the extension elements 30, which are connected to the support frame 20, may be formed as a single piece. The extension elements 30 and the support frames 20 may be made by the same materials. In some embodiments, the extension elements 30 and the support frames 20 are made by metal or hard plastic.

The retaining elements 40 are connected to the support frames 20. In this embodiment, each retaining element 40 is connected to one of the support frames 20. The retaining elements 40 are C shapes. In this embodiment, two adjacent retaining elements 40 extend along a circular path. Moreover, two adjacent retaining elements 40 surrounds the target object T1. The length of the retaining element 40 corresponds to one haft of the perimeter of the target object T1. In some embodiments, the length of the retaining element 40 is greater one quarter of the perimeter of the target object T1.

In this embodiment, the retaining element 40 and the extension element 30, which is connected the retaining element 40, may be formed as a single piece. The retaining elements 40 and the extension elements 30 may be made by the same materials. In some embodiments, the retaining elements 40 are made by metal or hard plastic.

The pins 50 are connected to the retaining elements 40. The pins 50 may be detachably disposed on the retaining elements 40. The pins 50 may be fastened to the retaining elements 40 by screws. The pins 50 and the retaining elements 40 may be made by the same or different materials. In some embodiments, the pins 50 are made by metal or hard plastic.

In this embodiment, there are four pins 50 connected to one retaining element 40, but it is not limited thereto. In some embodiments, there are at least two or five pins 50 connected to one retaining element 40. In some embodiments, the number of the pins 50 is in a range from 5 to 16 for supporting single target object T1, but the present disclosure is not limited thereto. The pins 50 connected to two adjacent retaining elements 40 are arranged in a circular path. In some embodiments, the pins 50 are evenly distributed on the circular path. The pins 50 are configured to support the edge of the target object T1.

The shapes of the pins 50 are different or the same. In some embodiments, the target object T1 has alignment marks M1 and an identity mark M2. Some of the pins 50 cover the alignment marks M1 and the identity mark M2. In this embodiment, the pins 50 covering the alignment marks M1 and the identity mark M2 are L shapes. The pins 50 not covering the alignment marks M1 and the identity mark M2 are elongated shapes, and have the same shape and size. Therefore, the pins 50 may be protect the alignment marks M1 and the identity mark M2 from covering by the coating materials.

In some embodiments, the alignment marks M1 and/or the identity mark M2 may also be configured to support the target object T1. Accordingly, the alignment marks M1 and/or the identity mark M2 may not be covered by the pins 50. In some embodiments, the pins 50 may be omitted where the alignment marks M1 and/or the identity mark M2 are disposed. As a result, the number of the pins 50 may be reduced.

As shown in FIGS. 1 and 2, each center axis AX2 passes through one of the centers of the target objects T1. Each center axis AX2 is parallel to and separated from the main axis AX1, and the center axes AX2 are arranged in a circular path. The rotation holder A30 may not rotate the target object T1 about the center axis AX2.

Figure 5:
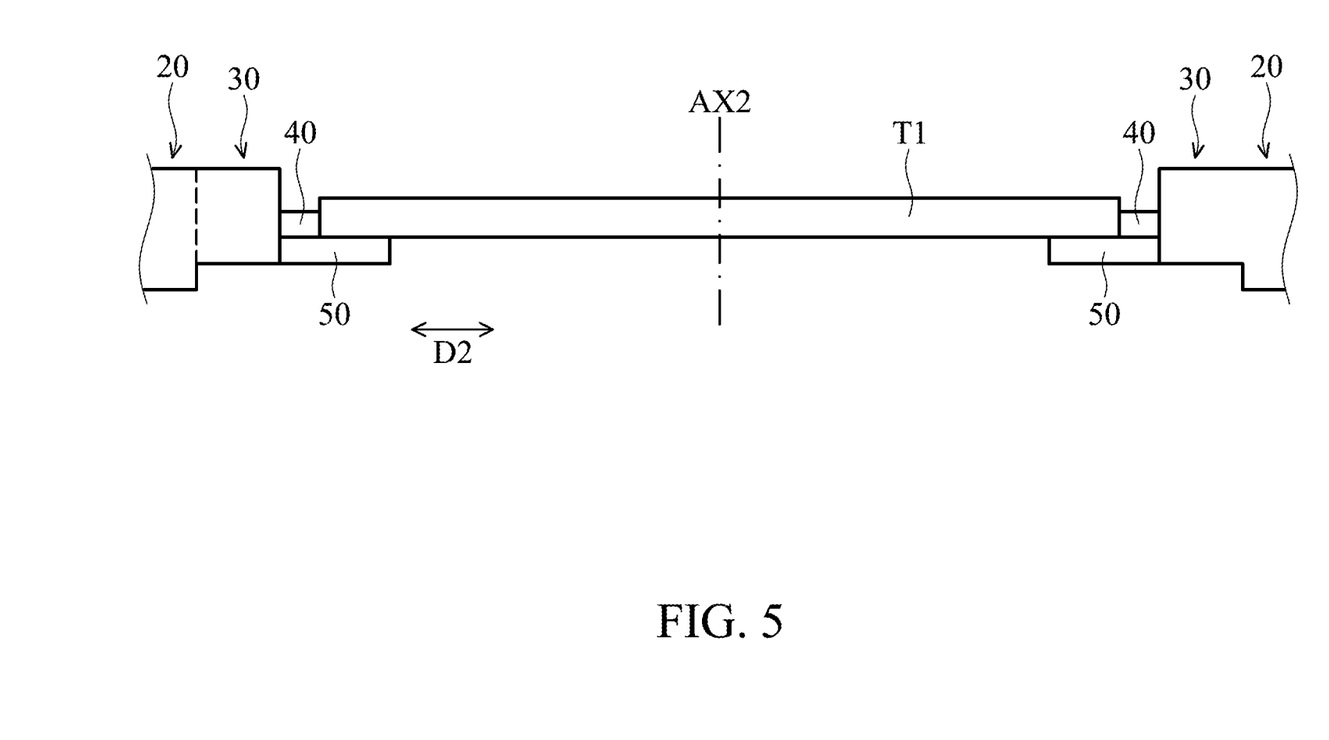
FIG. 5 is a cross-sectional view along the line BB of FIG. 2, and one target object is illustrated in FIG. 5.
Figure 6:
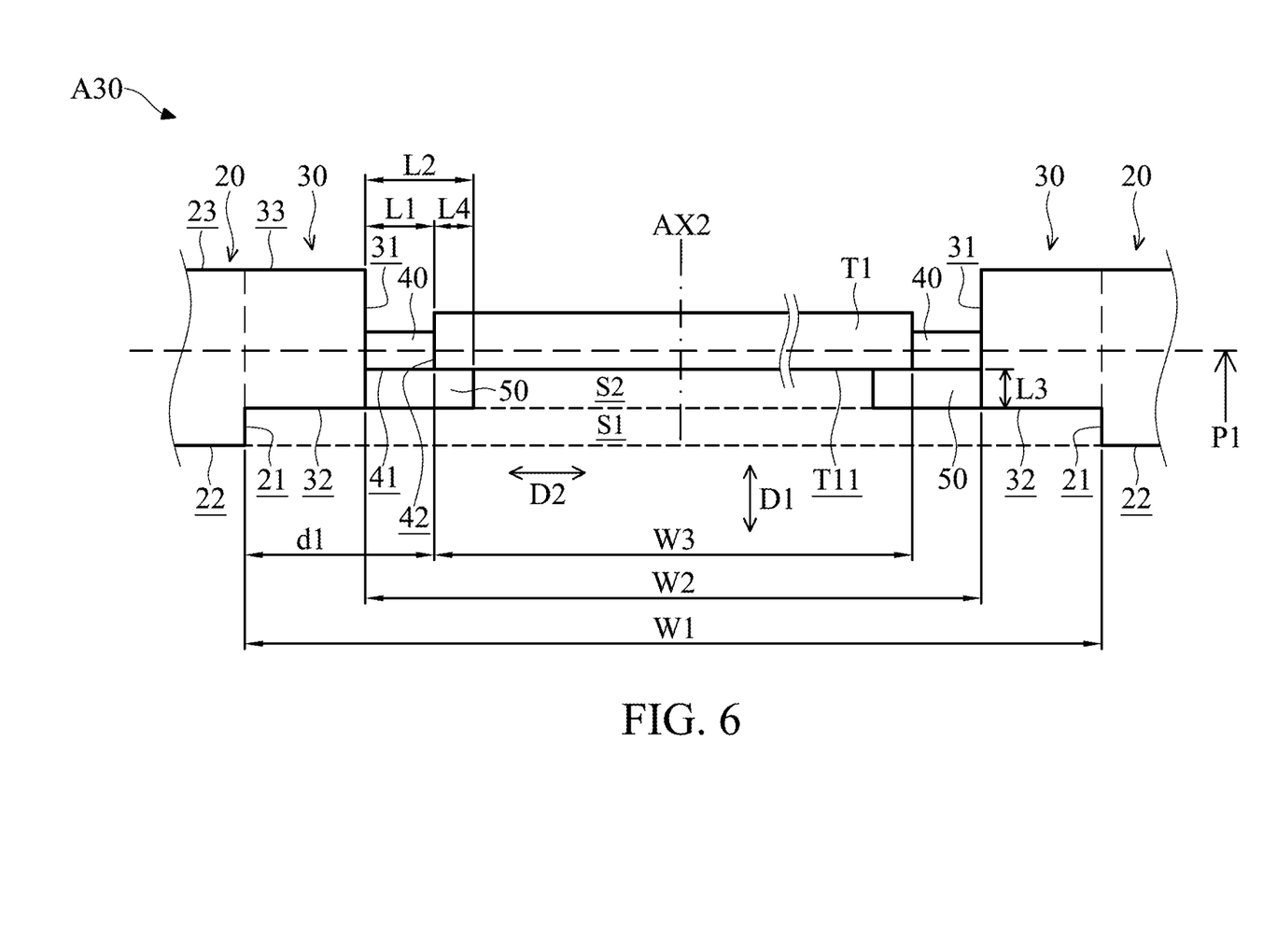
FIG. 6 is a cross-sectional view along the line BB of FIG. 2, and one target object is illustrated in FIG. 6, wherein the scale of FIG. 6 is greater than FIG. 5.

FIG. 5 is a cross-sectional view along the line BB of FIG. 2, and one target object T1 is illustrated in FIG. 5. FIG. 6 is a cross-sectional view along the line BB of FIG. 2, and one target object T1 is illustrated in FIG. 6, wherein the scale of FIG. 6 is greater than FIG. 5. The support frames 20, the retaining elements 40 and the pins 50 surround the center axis AX2, and the pins 50 extend toward the center axis AX2. The extension elements 30 are disposed around the center axis AX2 and separated from each other. The support frames 20, the extension elements 30, and the retaining elements 40 are arranged on a reference plane P1, and extend along the reference plane P1. In other words, the reference plane P1 passes through the support frames 20, the extension elements 30, and the retaining elements 40. Moreover, the pins 50 are under the reference plane P1. In this embodiment, the reference plane P1 may be perpendicular to the center axis AX2 and the main axis AX1 (as shown in FIG. 2).

Each support frame 20 has a side surface 21, a bottom surface 22 and a top surface 23. The side surface 21 is connected to the bottom surface 22 and the top surface 23. The side surface 21 may be perpendicular to the bottom surface 22 and the top surface 23. The bottom surface 22 may be parallel to the top surface 23, and extend perpendicular to the center axis AX2. In this embodiment, in a cross-sectional view, the side surface 21 may be a curved surface, and in a plan view, the side surface 21 may be a C shape. The bottom surface 22 may be a flat surface, and the top surface 33 may be a flat surface in a cross-sectional view.

The extension element 30 is connected to the side surface 21, and may extend perpendicular to the side surface 21. Each extension element 30 has a side surface 31, a bottom surface 32 and a top surface 33. The side surface 31 is a curved surface and a C shape. The side surface 31 is connected to the bottom surface 32 and the top surface 33. The side surface 31 may be perpendicular to the bottom surface 32 and the top surface 33. The bottom surface 32 may be parallel to the top surface 33, and extend perpendicular to the center axis AX2. In this embodiment, the bottom surface 32 is a flat surface in a cross-sectional view of the extension element 30 as shown in FIG. 6. The bottom surface 32 is a C shape in a bottom view of the extension element 30 as shown in FIG. 4. The top surface 33 is a flat surface in a cross-sectional view of the extension element 30 as shown in FIG. 6. The top surface 33 is a C shape in a top view of the extension element 30 as shown in FIG. 2.

In this embodiment, the bottom surface 32 is connected to the side surface 21, and the side surface 21 may be perpendicular to the bottom surface 32. Moreover, the top surface 33 is connected to the top surface 23. In other words, the top surface 33 and the top surface 23 may be formed as a flat plane.

The retaining element 40 is connected to the side surface 31, and may extend perpendicular to the side surface 31. The retaining elements 40 may be separated from the extension of the bottom surfaces 32 and the top surface 33 in a direction D1. In this embodiment, the direction D1 is parallel to the center axis AX2. In some embodiments, the distance between the retaining element 40 and the top surface 33 is greater than the distance between the retaining element 40 and the bottom surface 32.

Each retaining element 40 has a bottom surface 41 and an end 42. The bottom surface 41 is connected to the side surface 31, and the side surface 31 may be perpendicular to the bottom surface 41. In this embodiment, the bottom surfaces 41 are flat surfaces and C shapes. Each end 42 faces the center axis AX2, and separated from the side surface 31. In some embodiments, the bottom surface 41 is aligned with the process surface T11 of the target object T1. In other words, the bottom surface 41 and the process surface T11 extend along a plane that is perpendicular to the center axis AX2.

In some embodiments, the length L1 of the retaining elements 40 is in a range from 4 mm to 10 mm or 2 mm to 5 mm. The length L1 is measured in a direction that is perpendicular to the center axis AX2, such as the direction D2. In some embodiments, the direction D2 is any direction that is perpendicular to the center axis AX2.

In some embodiments, the distance d1 between the end 42 of the retaining element 40 and the side surface 21 of the support frame 20, which is close to the end 42 of the retaining element 40, is in a range from 18 mm to 30 mm and in a direction that is perpendicular to the side surface 21. In other words, the distance d1 is measured in a direction that is perpendicular to the center axis AX2. In some embodiments, the distance d1 is about 24 mm.

Each the pin 50 is connected to the bottom surfaces 41, and may extend parallel to the bottom surfaces 41. The pin 50 may be in contact with the side surface 31 or separated from the side surface 31. The target object T1 is configured to be put on the pins 50, and between the retaining elements 40. The pin 50 is protruded over the retaining element 40, which is connected to the pin 50, relative to the side surface 31 in a direction that is perpendicular to the center axis AX2. Moreover, the end of the pin 50 is closer to the center axis AX2 than the end 42 of the retaining element 40, which is connected to the pin 50. That is, a distance between the pin 50 and the center axis AX2 is shorter than a distance between the retaining element 40 and the center axis AX2.

In some embodiments, the length L2 of the pin 50 is in a range from 4 mm to 10 mm. In some embodiments, the length L2 of the pin 50 is greater than the length L1 of the retaining element 40. The length L2 of the pins 50 is measured in a direction that is perpendicular to the center axis AX2. In some embodiments, the thickness L3 of the pin 50 is in a range from 1 mm to 3 mm. In this embodiment, the thickness L3 of the pin 50 is about 2 mm. The thickness L3 of the pins 50 is measured in a direction that is parallel to the center axis AX2.

As shown in FIG. 4 and FIG. 6, the length L4 of a portion of the pin 50 that is in contact with the target object T1 is in a range from 2 mm to 5 mm, or less 5 mm. In this embodiment, the length L4 is about 3 mm. The width W4 of the portion of the pin 50 that is in contact with the target object T1 is in a range from 2 mm to 5 mm. The length L4 of the portion of the pin 50 is measured in a direction that is perpendicular to the center axis AX2. The width W4 of the portion of the pin 50 is measured in a direction perpendicular to the length L4.

As shown in FIG. 4 and FIG. 6, the area of the edge of the process surface T11 of the target object T1 is covered by the pins 50 is less. Since the area of the process surface T11 masked by the rotation holder A30 is less, the coating materials may be coated on the most area of the edge of the process surface T11. Therefore, the coating performance of the target object T1, especially the edge of the process surface T11, is improved, so as to improve the utilization rate of the target object T1.

As shown in FIG. 6, a bottom space S1 is formed between two adjacent side surfaces 21 of two adjacent support frames 20. A receiving space S2 is formed between the side surfaces 31 and in communication with the bottom space S1. The retaining elements 40 and the pins 50 are located in the receiving space S2. In some embodiments, the pins 50 are not located in the bottom space S1.

In this embodiment, the center axis AX2 passes through the center of the bottom space S1 and the center of the receiving space S2. The width W1 of the bottom space S1 is greater than the width W2 of the receiving space S2. The widths W1 and W2 are measured in a direction that is perpendicular to the center axis AX2, such as the direction D2.

In some embodiments, the width W1 of the bottom space S1 is 1.01 times to 1.1 times the width W2 of the receiving space S2. The width W1 of the bottom space S1 is in a range from 28 mm to 64 mm plus the width W3 of the target object T1. In some embodiment, the width W3 of the target object T1 may be the diameter of the target object T1. The width W3 of the target object T1 is in a range from 150 mm to 450 mm, but it is not limited there to. The width W2 of the receiving space S2 is in a range from 4 mm to 20 mm plus the width W3 of the target object T1. The widths W1, W2 and W3 may be measured in the same direction, such as the direction D2.

According to the design of the extension element 30 and the bottom space S1, the coating quality and the coating uniformity of the edge of the process surface T11 of the target object T1 are improved, and thus the utilization rate or the yield rate of the target object T1 may be improved.

Figure 7:
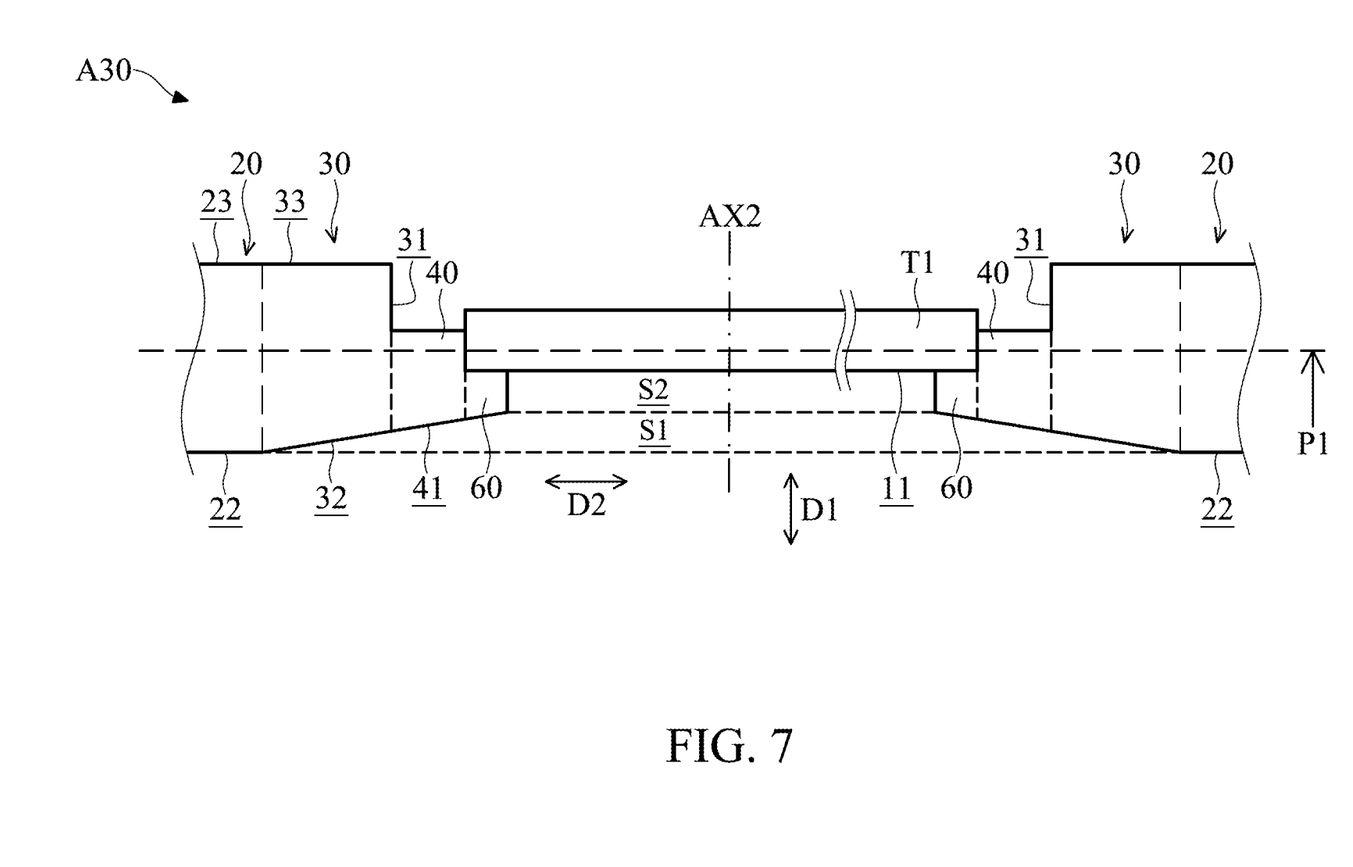
FIG. 7 is a cross-sectional view along the rotation holder in accordance with some embodiments of the present disclosure.

FIG. 7 is a cross-sectional view along the rotation holder in accordance with some embodiments of the present disclosure. In this embodiment, the rotation holder A30 does not includes the pins 50. The rotation holder A30 includes support portions 60 connected to the retaining elements 40. The support portions 60 are configured to support the target object T1.

In this embodiment, the support portions 60 are C shapes extending along the retaining elements 40. The length of each support portion 60 is substantially the same as the length of each retaining element 40. Therefore, the edge of the process surface T11 of the target object T1 is almost covered by the support portions 60. Therefore, the coating performance of the edge of the process surface T11 in FIG. 6 is greater than the coating performance of the edge of the process surface T11 in FIG. 7.

In this embodiment, the bottom surface 32 of the extension element 30 is inclined relative to the center axis AX2, and the bottom surface 41 of the retaining element 40 is inclined relative to the center axis AX2. The bottom surface 32 is connected to the bottom surface 22 and the bottom surface 41. The bottom surface 41 is connected to the bottom surface 32 and the support portion 60.

During a coating process, the coating materials toward the process surface T11 of the target object T1 may be affected by the structure of the extension element 30 and the retaining element 40 in FIG. 7. Therefore, the coating quality and the coating uniformity of the edge of the process surface T11 of the target object T1 in FIG. 6 may be greater than the coating quality and the coating uniformity of the edge of the process surface T11 of the target object T1 in FIG. 7.

In conclusion, the coating apparatus of the present disclosure utilizes a rotation holder to retain target objects. Depend on the design of the pins, the covered area of the edge of the target objects is less, and thus the coating performance and the utilization rate of the edge of the target object may be improved. Moreover, depend on the design of the extension element and the bottom space, the coating quality and the coating uniformity of the edge of the process surface T11 of the target object may be is improved.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A coating apparatus, comprising:
    a process chamber;
    a rotation device disposed in the process chamber; and
    a rotation holder connected to the rotation device, and comprising:
        two extension elements disposed around a center axis and separated from each other, wherein each of the two extension elements has a side surface;
        two retaining elements, wherein each of the two retaining elements has a bottom surface, one of the two retaining elements is connected to one of the side surfaces, and the other of the two retaining elements is connected to the other of the side surfaces; and
        two pins, wherein one of the two pins is connected to one of the bottom surfaces, and the other of the two pins is connected to the other of the bottom surfaces,
    wherein a target object is put on the two pins, and located between the two retaining elements, and the center axis passes through a center of the target object,
    wherein the rotation holder further comprises:
    a main base connected to the rotation device; and
    two support frames, wherein one of the two support frames is connected to the main base and one of the two extension elements, and the other of the two support frames is connected to the main base and the other of the two extension elements,
    wherein a bottom space is formed between the two support frames, a receiving space is formed between the side surfaces of the two extension elements and in communication with the bottom space, and the two retaining elements and the two pins are located in the receiving space.

2. The coating apparatus as claimed in claim 1, wherein the two extension elements, the two retaining elements and the two pins surround the center axis, and the two pins extend toward the center axis.

3. The coating apparatus as claimed in claim 2, wherein a distance between one of the two pins and the center axis is shorter than a distance between one of the two retaining elements and the center axis.

4. The coating apparatus as claimed in claim 2, wherein a length of one of the two retaining elements is in a range from 4 mm to 10 mm, and the length of one of the two retaining elements is measured in a direction that is perpendicular to the center axis.

5. The coating apparatus as claimed in claim 2, wherein a length of one of the two pins is in a range from 4 mm to 10 mm, and the length of one of the two pins is measured in a direction that is perpendicular to the center axis.

6. The coating apparatus as claimed in claim 2, wherein a thickness of one of the two pins is in a range from 1 mm to 3 mm, and the thickness of one of the two pins is measured in a direction that is parallel to the center axis.

7. The coating apparatus as claimed in claim 2, wherein the rotation device is configured to rotate the rotation holder about a main axis, and the rotation holder extends substantially perpendicular to the main axis, wherein the main axis is parallel to and separated from the center axis.

8. The coating apparatus as claimed in claim 1, wherein the target object has an alignment mark and an identity mark, and one of the two pins covers the alignment mark or the identity mark.

9. The coating apparatus as claimed in claim 1, wherein the center axis passes through a center of the bottom space and a center of the receiving space, and a width of the bottom space is greater than a width of the receiving space, and the width of the bottom space and the width of the receiving space are measured in a direction perpendicular to the center axis.

10. The coating apparatus as claimed in claim 9, wherein the width of the bottom space is 1.01 times to 1.1 times the width of the receiving space.

11. The coating apparatus as claimed in claim 9, wherein the width of the receiving space is in a range from 4 mm to 20 mm plus a width of the target object, and the width of the bottom space is in a range from 28 mm to 64 mm plus the width of the target object.

12. The coating apparatus as claimed in claim 1, wherein each of the two support frames further has one side surface, each of the two extension elements further has one bottom surface, one of the bottom surfaces is connected to one of the side surfaces of the two support frames, and the other of the bottom surfaces is connected to the other of the side surfaces of the two support frames,
   wherein the side surfaces of the two support frames extend perpendicular to the bottom surfaces of the two extension elements,
   wherein in a cross-sectional view, the side surfaces of the two support frames are curved surfaces, the bottom surfaces of the two extension elements are flat surfaces, and in a plan view, the side surfaces of the two support frames and the bottom surfaces of the two extension elements are C shapes.

13. The coating apparatus as claimed in claim 1, wherein each of the two support frames further has one side surface, and a distance between an end of one of the two retaining elements and one of the side surfaces of the two support frames, which is close to the one of the two retaining elements, is in a range from 18 mm to 30 mm and in a direction that is perpendicular to the one of the side surfaces.

14. The coating apparatus as claimed in claim 1, further comprising a sputtering device disposed in the process chamber and under the rotation holder, wherein the sputtering device is configured to dispense a coating material toward the target object.

15. The coating apparatus as claimed in claim 1, further comprising:
   a vacuum device connected to the process chamber and configured to vacuum the process chamber; and
   an ion assisted deposition disposed in the process chamber and configured to emit ions to the rotation holder.

16. The coating apparatus as claimed in claim 1, wherein the side surfaces of the two extension elements extend perpendicular to the bottom surfaces of the two retaining elements.

17. The coating apparatus as claimed in claim 1, wherein in a cross-sectional view, the side surfaces of the two extension elements are curved surfaces, the bottom surfaces of the two retaining elements are flat surfaces, and in a plan view, the side surfaces of the two extension elements and the bottom surfaces of the two retaining elements are C shapes.

18. The coating apparatus as claimed in claim 1, wherein a gap is formed between two adjacent ends of the two extension elements.

\* \* \* \* \*